United States Patent [19]

Horvath et al.

[11] Patent Number: 5,159,531
[45] Date of Patent: Oct. 27, 1992

[54] MULTIPLE RADIAL FINGER CONTACT COOLING DEVICE

[75] Inventors: Joseph L. Horvath; Mark H. McLeod, both of Poughkeepsie; Carl Yakubowski, Hyde Park, all of N.Y.

[73] Assignee: International Business Machines Corporation, Armonk, N.Y.

[21] Appl. No.: 843,680

[22] Filed: Feb. 28, 1992

[51] Int. Cl.⁵ .............................. H05K 7/20
[52] U.S. Cl. .................. 361/386; 165/185; 174/16.3
[58] Field of Search ............ 361/382, 386, 387, 388, 361/389, 385; 174/16.3; 165/80.2, 80.3, 80.4, 185; 357/81, 82

[56] References Cited

U.S. PATENT DOCUMENTS

| | | | |
|---|---|---|---|
| 4,156,458 | 5/1979 | Chu et al. | 165/81 |
| 4,415,025 | 11/1983 | Horvath | 361/386 |
| 4,442,450 | 4/1984 | Lipschutz | 357/81 |
| 4,559,580 | 12/1985 | Lutfy | 361/385 |
| 4,701,828 | 10/1987 | Weiner | 361/383 |
| 4,770,242 | 9/1988 | Daikoku et al. | 165/185 |

Primary Examiner—Gerald P. Tolin
Attorney, Agent, or Firm—Floyd A. Gonzalez

[57] ABSTRACT

In an electronic package, improved disk shaped thermal bridge elements provide multiple conductive paths between devices to be cooled and a cold plate. The thermal bridge elements are disks progressively stacked and having bulge shapes and radial finger contacts for providing multiple compliant heat conduction paths between each device and a cold plate.

11 Claims, 3 Drawing Sheets

MULTIPLE RADIAL FINGER CONTACT COOLING DEVICE

BACKGROUND OF THE INVENTION

1. Technical Field

This invention relates to techniques and structures for the dissipation of thermal energy generated by electronic devices. More particularly, the present invention relates to conduction elements for cooling electronic devices in single device or multi-device integrated circuit packages assemblies where the devices are mounted on substrates with solder bonds, and the heat sink or cover mounted in close proximity to the devices.

The high circuit densities in modern integrated circuit devices require that the heat generated by their operation be efficiently removed in order to maintain the temperature of the devices within the limits that will keep the operating parameters of the devices within predetermined ranges, and also prevent the destruction of the device by overheating. The problems of heat removal are increased when the device is connected to the supporting substrate with solder terminals. In such solder bonded devices, the heat transfer that can be accomplished through the solder bond is limited, as compared to back bonded devices.

Cooling of electronic devices can be achieved by immersing the devices in a suitable liquid coolant. However, these cooling methods can result in corrosion of the device and substrate metals, and also present rework problems. Cooling can also be achieved by providing a conducting link of material between the device and the cap or cold plate.

This invention is an improved structure for conduction cooling of electronic devices solder bonded to a substrate where the heat is removed from the back side of the device to a cap or cold plate.

2. Background of the Invention

The following documents relate to various structures for removing heat from a solder bonded electronic device.

U.S. Pat. No. 4,415,025 issued Nov. 15, 1983 to Horvath for "Thermal Conduction Element for Semiconductor Devices" discloses a package containing a disk shaped thermal bridge comprising a bulge shaped disk with a first set of inwardly extending slots and a second set of outwardly extending slots emanating from the center of the disk.

U.S. Pat. No. 4,442,450 issued Apr. 10, 1984 to Lipschutz et al. for "Cooling Element for Solder Bonded Semiconductor Devices" discloses a package containing a thermal bridge which includes a thick metal sheet provided with cuts that define at least one tab element containing grooves to make it bendable and a spring means to selectively urge the tab element into contact with the device.

U.S. Pat. No. 4,156,458 issued May 29, 1979 to Chu et al. for "Flexible Thermal Connector For Enhancing Conduction Cooling" discloses a heat conductive metallic foil bundle with micro-slices to provide flexibility.

U.S. Pat. No. 4,770,242 issued Sept. 13, 1988 to Daikoku et al. for "Cooling Devices of Semiconductor Chips" discloses a thermal bridge device comprising interlaced fin members whose contact force between the device and its housing is accomplished through use of a spring.

SUMMARY OF THE INVENTION

The present invention provides an improved cooling element adapted to be positioned between a device to be cooled and a module cap or cold plate to form a heat conduction bridge between the device and cap or cold plate.

It is a primary object of the present invention to provide a thermal bridge element comprising of at least two concentrically placed bulge shaped disks of heat conducting material. The disks include radial finger contacts which act independently to contact the electronic device. The disks are stackable one on top of another in a manner which enables each disk's set of radial finger contacts to conduct heat separately from the device to be cooled.

It is another object of the present invention to provide an improved cooling element whose coefficient of thermal conduction can be varied by changing the number of the bulge shaped stacked disks in a stacked series. The density of the radial fingers contacts can be altered to further customize the thermal conduction profile of the cooling element.

It is yet another object of this present invention to provide an improved cooling element having a series of bulge shaped disks in which each bulge shaped disk's radial finger contacts provide spring-like compliance asserting contact between the device and the cold plate.

It is still another object of this present invention to provide an improved cooling element having a bulge shaped disks series in which each bulge shaped disk in the stacked series is comprised of a distinct type of heat conducting material.

It is a still further object of this present invention to provide an improved cooling element having a bulge shaped disks series where devices to be cooled have a non-uniform thermal profile across their surface and employ regional specific cooling requirements.

The foregoing and other objects, features and advantages of the invention will be apparent from the following more particular description of the preferred embodiment of the invention as illustrated in the drawings.

DISCLOSURE OF THE PREFERRED EMBODIMENT

Figure 1:
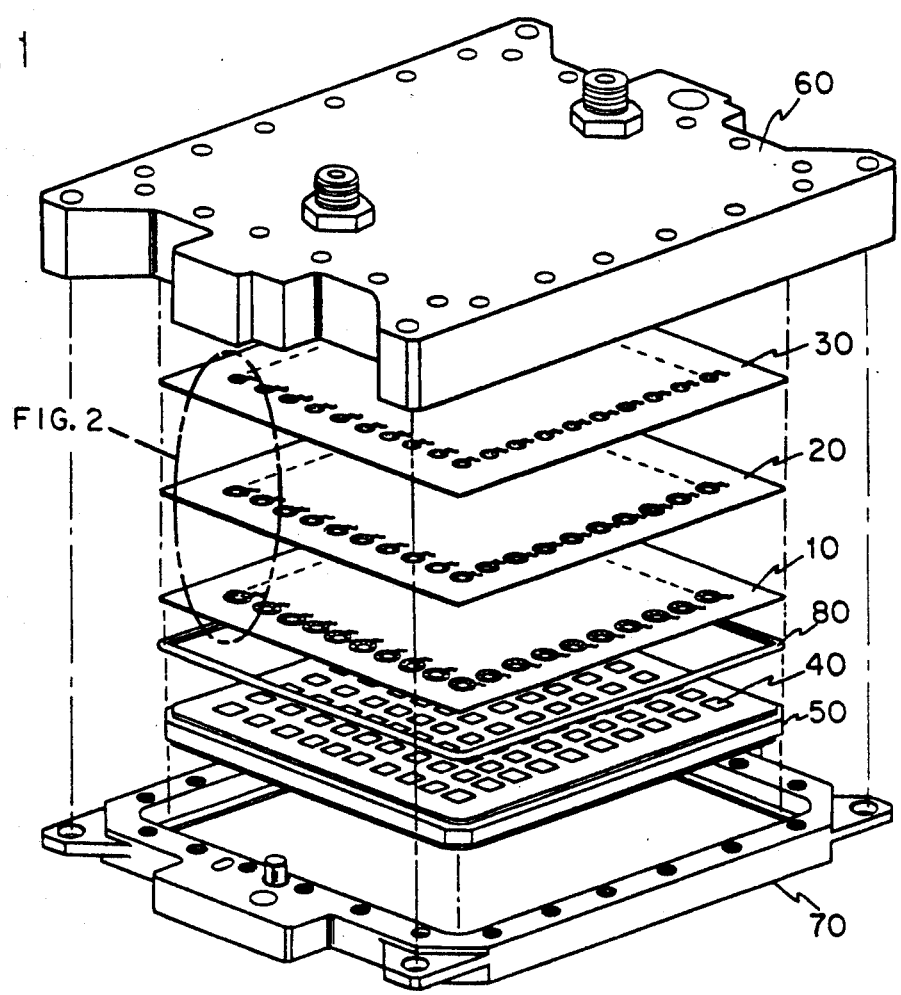
FIG. 1 is an exploded view of an assembly, having devices to be cooled and thermal bridge elements of the present invention.
Figure 3:
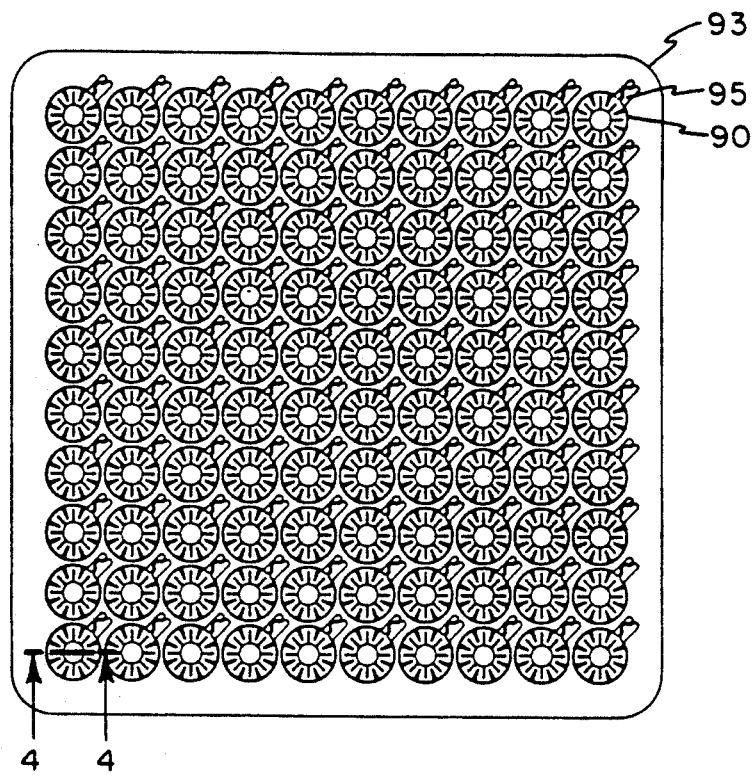
FIG. 3 is an elevational top view of a typical planar arrangement of one layer of the thermal bridge elements of FIGS. 1 and 2.

Referring now to FIG. 1, there is depicted a typical electronic package having substrate 50 with mounted devices 40 and thermal bridge elements 10, 20 and 30 secured by a suitable seal 80 between cold plate cap 60 and substrate carrier 70. Substrate 50 can be formed of any dielectric material and contains suitable circuitry for interconnecting devices on the top surface using solder bonds or pins (not shown). Substrate 50 can be formed of inorganic resins, ceramic or any suitable dielectric material. Substrate 50 is typically provided with a metallurgy pattern (not shown) within or on its top surface that interconnects devices 40 mounted thereon. The heat generated in devices 40 during operation is partially conducted away from the devices through solder connections to the substrate 50 which acts as a heat sink. However it is usually necessary to conduct the major portion of the heat energy generated in devices 40 from one side of the devices through thermal bridge elements 10, 20 and 30 to housing or liquid cooled cold plate 60. The top view of one of the thermal bridge planar arrays 10, 20, and 30 of FIG. 1 is depicted in FIG. 3, which illustrates one method for organizing the thermal bridge elements 90 attached by a suitable mounting tab 95.

The invention provides a thermal heat conduction assembly consisting of at least two concentrically stacked bulge shaped disks 10, 20 and 30 with a plurality of radial finger contacts.

Figure 2:
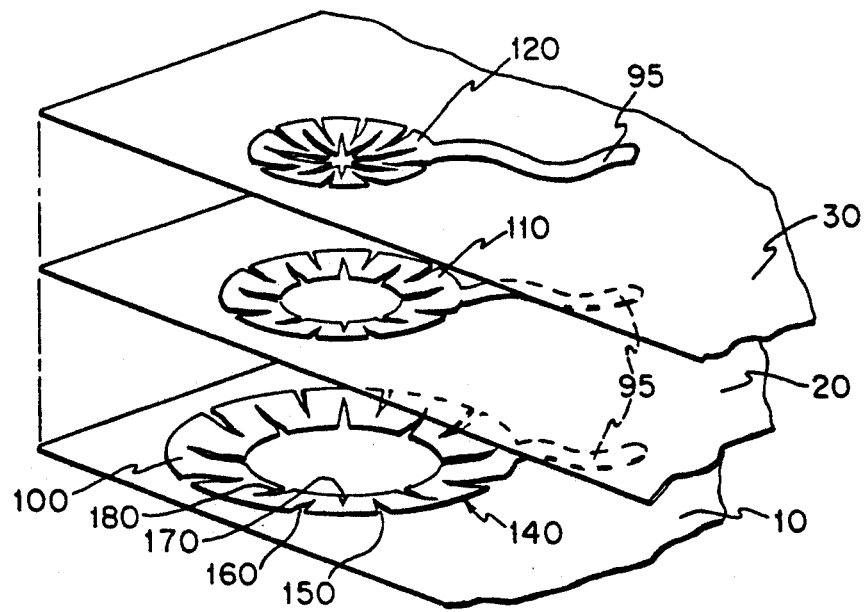
FIG. 2 is an enlargement showing details of the thermal bridge elements of FIG. 1.
Figure 4:
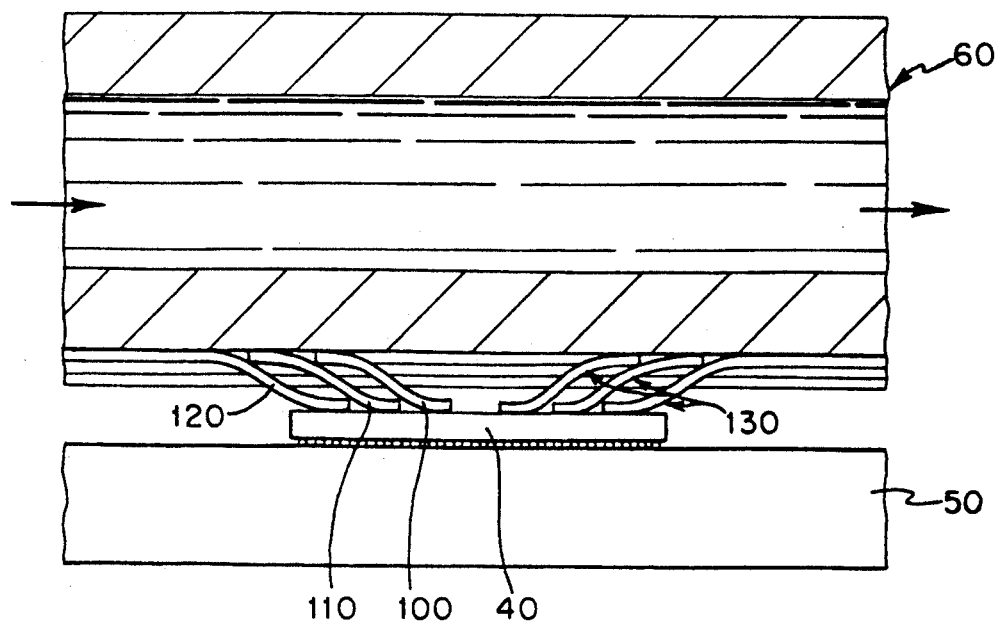
FIG. 4 is a sectional view taken along section line 4—4 of FIG. 3, illustrating the relationship of the thermal bridge elements and the device to be cooled.

Referring to FIG. 2, the details of the bulge shaped disk elements are discussed. As shown in FIG. 2, the disks 100, 110 and 120 are stackable in a progression which facilitates the direct contact between heat conduction fingers of the upper bulge shaped disk to the device 40 of FIG. 1 thereby providing multiple heat conduction paths. This distinction of providing multiple heat conduction paths is illustrated further in FIG. 4. The sectional view of FIG. 4 illustrates the ability of each bulge shaped disk's compliant radial fingers 100, 110 and 120 to contact the device 40. As indicated in FIG. 2 the disks are shown with a circular periphery 140 having notches 150 and 160 emanating from the outer perimeter and notches 170 and 180 emanating from the inner perimeter for forming the radial finger contacts 190. Alternatively, the disks could have a polygon shape.

The thermal bridge elements 100, 110 and 120 are basically bulge shaped disks made out of thermally conductive material, typically a metal or alloy, preferably an alloy in which copper or silver is a major constituent. The thermally conductive material is flexible, compliant and accommodates the differences in distances between devices 40 and cold plate 60 under thermal changes to maintain a constant contact. The bulge shaped disks elements 100, 110, and 120 can be of any suitable diameter to allow stacking. The largest of the series of progressively stacked bulge shaped disks' is typically 10% smaller than the device 40. And the remaining smaller disks' size adjusted to provide positioning room for the contacting radial fingers. The number of bulge shape disks 100, 110 and 120 in the stacked progression is depicted as three, however this number can be any number greater than two in the progressively stacked series. Altering the number of disks in the progressively stacked series enables the customization to different thermal profiles. Moreover, customization of thermal profiles can be achieved through varying the density of the radial finger contacts on each bulge shaped disk in the progressively stacked series. Furthermore, the material of each individual bulge shaped disk in the progressively stacked series can be different from one to another in the series to facilitate non-uniform cooling across the surface of device 40. Bulge shaped disks 100, 110 and 120 can be produced by any suitable technique. A useful technique for producing the elements is providing a masking coating, on a sheet of thermally conductive material 93, exposing the coating to define the radial finger pattern, developing the resist, and etching away the exposed areas in between the radial fingers. Alternatively the disks can be produced by stamping the elements with a suitable dye or by an electrical discharge process. After the radial fingers have been formed, the disk elements are shaped to provide a cross-sectional shape illustrated generally in FIG. 4 of the drawings. Individual disk elements 90 are attached to the planar sheet 93 such that sheet 93 and its disks 90 may be positioned over devices 40 at one time. It is understood that the bulge shaped disks 100, 110 and 120 maybe located over a single device 40, to provide cooling to a single device or a selected number of devices, as desired.

In order to improve the interface contact between the bulge shaped disk elements 100, 110 and 120 the device 40 and the spaced surface of the cold plate 60, an alloy coating 130 can be deposited on one or both surfaces of the thermal bridged elements. The coating may comprise any suitable materials or, alternatively thermal grease maybe used to improve conduction. During heating, the alloy or grease softens thereby enabling it to conform closely to the contact surfaces of the device and cold plate.

In another embodiment a which only one device or a few devices are to be cooled, the thermal bridge elements 100, 110 and 120 are not fabricated on a planar array but are instead stacked separately on each device as required.

Figure 5:
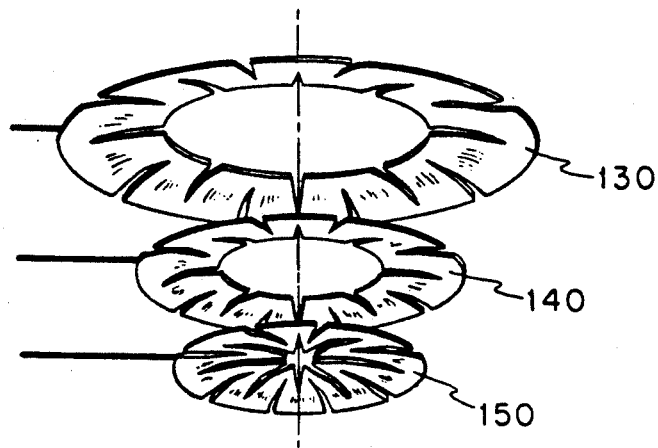
FIG. 5 is an enlargement of another embodiment of the thermal bridge elements of FIG. 1 wherein the stacked disks are arranged in an inverted manner.
Figure 6:
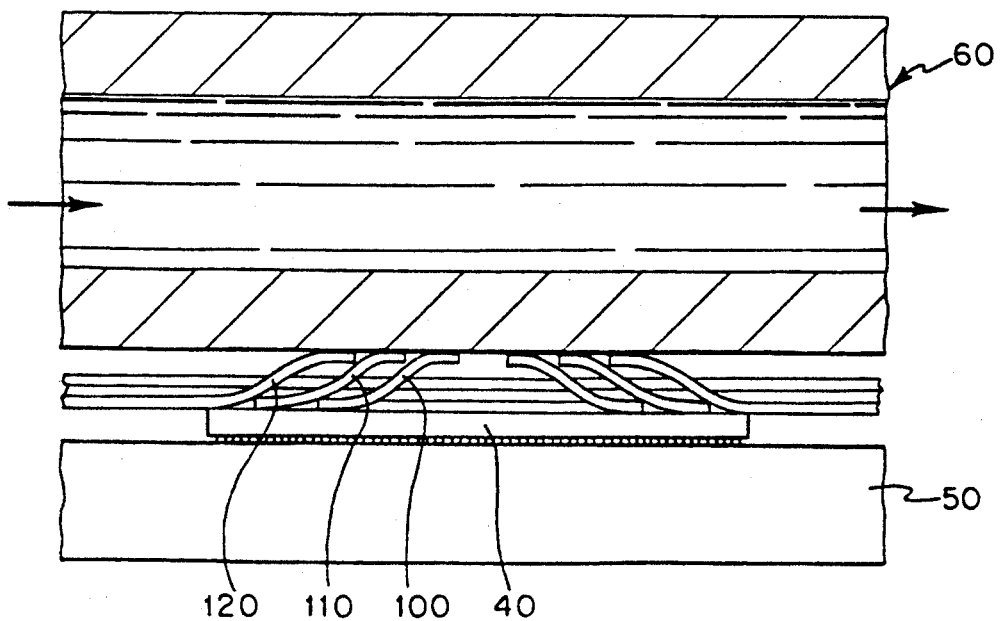
FIG. 6 is a sectional view illustrating the relationship of the thermal bridge elements and the device to be cooled when using the thermal bridge elements stacked in the inverted manner.

Another embodiment employs the thermal bridge element in the electronic package of FIG. 1 in a inverted manner. FIGS. 5 and 6 illustrate this embodiment wherein thermal bridge elements 130, 140 and 150 are in the inverted progression with the largest disk being on the top of the stacked series and the smallest disk being at the bottom of the stacked series.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letter Patent is:

1. In an electronic package having a substrate, at least one device mounted on said substrate, and a cold plate located over and in close proximity to the device, a thermal bridge assembly for conducting heat from said device to said cold plate, said thermal bridge assembly comprising:

at least two concentrically placed bulge shaped disks of heat conductive material, each of said bulge shaped disks containing radial finger contacts independently acting to contact both said device and said cold plate, each of said bulge shaped disks further having circular openings therein and being progressively stacked with said radial finger contacts placed in the circular opening of each preceding disk, thereby providing multiple heat conductive paths between said device and said cold plate.

2. The combination element of claim 1 wherein said bulge shaped disks are coated with an alloy for lowering the thermal interface resistance.

3. The combination element of claim 1 further comprising thermally conductive grease trapped between said bulge shaped disks.

4. The combination element of claim 1 wherein said bulge shaped disks comprises an elevated central portion as viewed from the top of said cold plate.

5. The combination element of claim 1 wherein said bulge shaped disks comprises an indented central portion as viewed from the top of said cold plate.

6. The combination element of claim 1 wherein the peripheral shape of the bulge shaped disks is circular.

7. The combination element of claim 1 wherein the peripheral shape of the bulge shaped disks is a polygon.

8. The combination element of claim 1 wherein said radial finger contacts together with the rest of the said bulge shaped disks provide spring-like compliance asserting contact between said device and said cold plate.

9. In an electronic package having a substrate, a plurality of devices mounted on said substrate, and a cold plate located over and in close proximity to the devices, a thermal assembly for conducting heat from said devices to said cold plate, said thermal bridge assembly comprising:

at least two concentrically placed bulge shaped disks of heat conductive material, each of said bulge shaped disks containing radial finger contacts independently acting to contact both said devices and said cold plate, each of said bulge shaped disks further having circular openings therein and being progressively stacked with said radial finger contacts placed in the circular opening of each preceding disk, thereby providing multiple heat conductive paths between said devices and said cold plate.

10. The combination element of claim 8 wherein the bulge shaped disks are attached in an array on a planar sheet such that the planar sheet and its bulge shaped disks may be positioned over a plurality of devices at one time.

11. The combination element of claim 8 wherein the bulge shaped disks are attached in an array on a planar sheet such that the planar sheet and its bulge shaped disks may be positioned over a selected set of devices at one time.

* * * * *

UNITED STATES PATENT AND TRADEMARK OFFICE
CERTIFICATE OF CORRECTION

PATENT NO. : 5,159,531

DATED : Oct. 27, 1992

INVENTOR(S) : J.L. Horvath et al

It is certified that error appears in the above-identified patent and that said Letters Patent is hereby corrected as shown below:

```
Col. 5, claim 2, line 1 delete "element".
Col. 5, claim 3, line 1 delete "element".
Col. 5, claim 4, line 1 delete "element".
Col. 5, claim 5, line 1 delete "element".
Col. 5, claim 6, line 1 delete "element".
Col. 5, claim 7, line 1 delete "element".
Col. 5, claim 8, line 1 delete "element".
Col. 5, claim 9, line 4 insert --bridge-- between thermal and
                                    assembly.
Col. 6, claim 10, line 1 delete "element".
Col. 6, claim 11, line 1 delete "element".
```

Signed and Sealed this

Twenty-eighth Day of September, 1993

Attest:

BRUCE LEHMAN

*Attesting Officer*   *Commissioner of Patents and Trademarks*